(12) United States Patent
Ordentlich et al.

(10) Patent No.: US 8,902,929 B2
(45) Date of Patent: Dec. 2, 2014

(54) APPROXIMATE ENUMERATIVE CODING METHOD AND APPARATUS

(75) Inventors: Erik Ordentlich, San Jose, CA (US); Ron M. Roth, Haifa (IL)

(73) Assignee: Hewlett-Packard Developent Company, L.P., Houston, TX (US)

( * ) Notice: Subject to any disclaimer, the term of this patent is extended or adjusted under 35 U.S.C. 154(b) by 378 days.

(21) Appl. No.: 13/258,394

(22) PCT Filed: Jun. 26, 2009

(86) PCT No.: PCT/US2009/048957
§ 371 (c)(1),
(2), (4) Date: Sep. 21, 2011

(87) PCT Pub. No.: WO2010/151268
PCT Pub. Date: Dec. 29, 2010

(65) Prior Publication Data
US 2012/0087381 A1    Apr. 12, 2012

(51) Int. Cl.
*H04J 3/00*    (2006.01)
*H03M 5/14*    (2006.01)

(52) U.S. Cl.
CPC .................................... *H03M 5/145* (2013.01)
USPC ................ 370/476; 375/E7.047; 375/E7.044; 375/E7.046; 375/E7.072; 382/240; 382/154

(58) Field of Classification Search
CPC .................. H04N 19/00781; H04N 19/00478; H04N 19/00121; H04J 3/00
USPC ............. 370/476; 382/240, 154; 375/E7.047, 375/E7.044, E7.045, E7.072
See application file for complete search history.

(56) References Cited

U.S. PATENT DOCUMENTS

| 6,175,317 B1 * | 1/2001 | Ordentlich et al. ............. 341/58 |
| 2003/0084025 A1 * | 5/2003 | Zuzarte ............................. 707/2 |

OTHER PUBLICATIONS

Erik Ordentlich et al.., "Capacity Lower Bounds and Approximate Enumerative Coding for 2-D Constraints," IEEE Intl. Symp. on Information Theory Jun. 24-29, 2007, pp. 1681-1685.

(Continued)

*Primary Examiner* — Charles C Jiang
*Assistant Examiner* — Jamal Javaid
(74) *Attorney, Agent, or Firm* — North Shore Associates; J. Michael Johnson

(57) ABSTRACT

An approximate enumerative coding method (100, 200) and apparatus (300) employ a cardinality-approximating (C-A) lower bound in mapping a message M to a 2-dimensional (2-D) codeword array that satisfies a 2-D constraint. The method (100) includes encoding the message M as a codeword array X using an encoder apparatus. The encoding determines entries in a codeword array X using the C-A lower bound. The C-A lower bound is a function of several terms, namely a memory term k, a cardinality of a set of sequences satisfying a horizontal constraint, a columnar extension probability of the 2-D constraint, and a non-negative constant that is a function of the columnar extension probability. The apparatus (300) includes an encoder processor (310), memory (320) and a computer program (330) stored in the memory (320) and executed by the encoder processor (310).

15 Claims, 2 Drawing Sheets

(56) References Cited

OTHER PUBLICATIONS

PCT International Search Report, Patent Application No. PCT/US2009/048957, Hewlett-Packard Development Company, L.P., Mar. 24, 2010.
Tal, Ido et al. "On row-by-row coding for 2-D constraints," IEEE ISIT 2006, Jul. 15, 2006.
Talyansky, Roman et al., "Efficient Code Constructions for Certain Two-Dimensional Constraints", IEEE Trans. on Information Theory, vol. 45, No. 2, Mar. 1999.
Thomas M. Cover, "Enumerative Source Coding," IEEE Transactions on Information Theory, vol. IT-19, No. 1, Jan. 1973, pp. 73-77.

* cited by examiner

APPROXIMATE ENUMERATIVE CODING METHOD AND APPARATUS

CROSS-REFERENCE TO RELATED APPLICATIONS

N/A

STATEMENT REGARDING FEDERALLY SPONSORED RESEARCH OR DEVELOPMENT

N/A

BACKGROUND

Enumerative coding provides a mapping from a fixed length message to a codeword comprising a sequence of symbols. Further, the mapping of enumerative coding may generate codewords in which the symbol sequences satisfy one or more predetermined constraints. For example, the predetermined constraint for an exemplary binary codeword may stipulate that there is at least a zero (0) between any two ones (1). The ability of enumerative coding to generate codewords that satisfy a predetermined constraint has broad implications for a variety of fields including, but not limited to, data storage and transmission. Enumerative coding was first described by Thomas M. Cover, "Enumerative Source Coding," IEEE Transactions on Information Theory, Vol. IT-19, No. 1, January 1973, pp. 73-77.

In general, the codewords produced by enumerative coding may be considered either one dimensional (1-D) codewords or two dimensional (2-D) codewords (or 2-D codeword arrays). For example, the codeword may be represented by a string of symbols as a 1-D codeword (e.g., 110010010). Alternatively, the codeword may be represented as a 2-D array of symbols referred to as a codeword array. For example, the 2-D codeword array may be represented as a rectangular array having m rows and n columns. As with codewords, the constraints may also be 1-D constraints or 2-D constraints, especially when considering 2-D codeword arrays. For example, a 2-D constraint may constrain symbol sequences in both the rows and the columns of the 2-D codeword array.

In general, enumerative coding may be readily implemented in an exact form for 1-D codewords with 1-D constraints. Unfortunately 2-D codeword arrays that satisfy 2-D constraints pose a significant challenge for enumerative coding, especially as a size of the 2-D codeword arrays is increased. As such, for enumerative coding that involves relatively large 2-D codeword arrays, approximate enumerative coding has been introduced (see for example, Ordentlich et al., "Capacity Lower Bounds and Approximate Enumerative Coding for 2-D Constraints," IEEE Intl. Symp. On Information Theory, Jun. 24-29, 2007, pp. 1681-1685).

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

Figure 1:
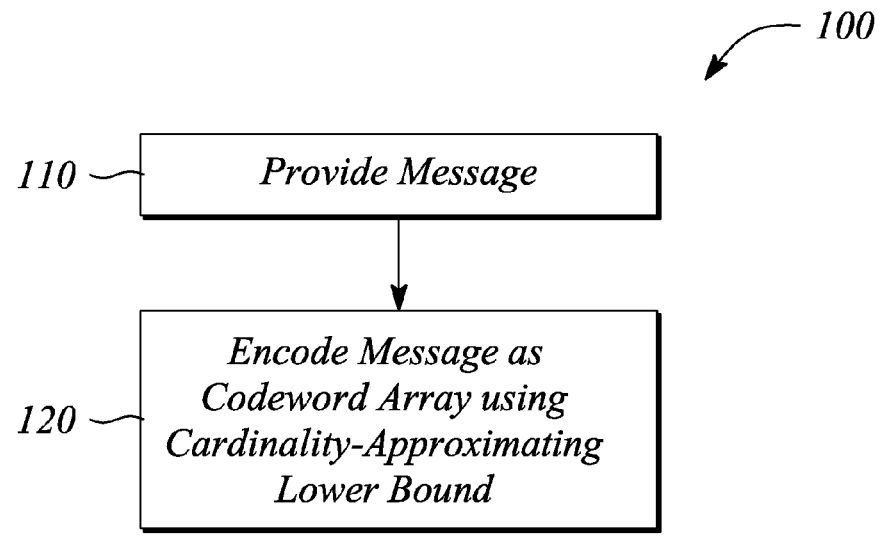
FIG. 1 illustrates a flow chart of a method of approximate enumerative coding satisfying a 2-dimensional (2-D) constraint, according to an embodiment of the present invention.

Certain embodiments of the present invention have other features that are one of in addition to and in lieu of the features illustrated in the above-referenced figures. These and other features of the invention are detailed below with reference to the preceding drawings.

DETAILED DESCRIPTION

Embodiments of the present invention employ enumerative coding that satisfies a two-dimensional (2-D) constraint on codewords to one or more of encode a message and decode a message. In particular, embodiments of the present invention provide an approximate lower bound on a cardinality of a set of codewords where the set satisfies the 2-D constraint. In some embodiments, the present invention provides a plurality of approximate lower bounds on a plurality of corresponding cardinalities. The approximate lower bound(s) on the cardinality is employed instead of an exact cardinality (or exact cardinalities) to provide encoding and decoding of the message using enumerative encoding. As such, enumerative coding according to various embodiments of the present invention is effectively an 'approximate enumerative coding' that provides a 2-D constrained code mapping of arbitrary fixed-length messages into 2-D codeword arrays that satisfy the 2-D constraint. The use of an approximate lower bound on the cardinality may facilitate enumerative coding in conjunction with relatively large 2-D codeword arrays. Such relatively large 2-D codeword arrays and 2-D constrained code mappings have many practical applications including, but not limited to, dense-wavelength division multiplexing (DWDM) based optical communications, 2-D barcodes, denser conventional magnetic and optical data storage technologies, holographic data storage, nanocrossbar storage technologies, as well as conventional magnetic and optical storage technologies.

According to various embodiments of the present invention, enumerative coding employs an ordered, finite alphabet $\Sigma$ comprising symbols $\omega$ (i.e., $\omega \epsilon \Sigma$). For example, the alphabet $\Sigma$ may comprise a set of binary symbols $\{0,1\}$ such that $\omega$ equals either '0' or '1'. In another example, the alphabet $\Sigma$ may comprise an ordered set of symbols representing hexadecimal numbers. In a first representation, the alphabet $\Sigma$ may be given by the ordered set of symbols $\omega$ ranging from '0' to 'F' (i.e., $\Sigma=\{0, 1, 2, 3, 4, 5, 6, 7, 8, 9, A, B, C, D, E, F\}$). According to another effectively equivalent representation, the hexadecimal numbers may be in a binary form, such that $\Sigma=\{0000, 0001, \ldots, 1111\}$. In yet another example, the alphabet $\Sigma$ may comprise symbols $\omega$ that are letters in a natural alphabet such as the English alphabet (e.g., $\Sigma=\{a, b, c, \ldots, z\}$).

Herein, a 'codeword' is defined as a sequence of symbols x selected from the alphabet $\Sigma$ and arranged in a prescribed pattern. For example, a codeword defined on a binary alphabet $\Sigma=\{0,1\}$ may comprise a sequence '011001010111'. The exemplary codeword '011001010111' has a length of twelve (12) since the codeword contains twelve (12) symbols x. In some embodiments, a codeword may be represented by or arranged as a codeword array.

Herein, a 'codeword array' is defined herein as a rectangular, 2-dimensional (2-D) array of the symbols x selected from the alphabet $\Sigma$. In general herein, the 2-D codeword array is arranged in a prescribed pattern having m rows and n columns where m and n are positive integers. As such, the 2-D codeword array may be referred to as an m×n array. For example, the exemplary codeword represented by a symbol sequence x='011001010111' may be represented by a 4×3 codeword array X as $$X = \begin{bmatrix} 0 & 1 & 1 \\ 0 & 0 & 1 \\ 0 & 1 & 0 \\ 1 & 1 & 1 \end{bmatrix}$$

in which blocks of three symbols x are sequentially placed into successive rows of the array. Alternatively, the exemplary codeword '011001010111' may be represented by another 4×3 codeword array X' as $$X' = \begin{bmatrix} 0 & 0 & 0 \\ 1 & 1 & 1 \\ 1 & 0 & 1 \\ 0 & 1 & 1 \end{bmatrix}$$

where the sequence of symbols in the exemplary codeword are placed in successive columns. Regardless of the pattern in which the symbols are placed, the codeword and the corresponding codeword array X represent a one-to-one mapping. As such, the terms 'codeword' and 'codeword array' may be employed interchangeably herein unless a distinction is necessary for proper understanding.

Further herein, codeword arrays may be constrained by a 2-dimensional (2-D) constraint, according to various embodiments. In particular, the 2-D constraint establishes a set of 'allowable' 2-D codewords that is selected from a set of all possible codeword arrays. The 2-D constraint effectively establishes which codeword arrays are 'allowed' and which codeword arrays are not allowed. As such, a particular codeword array X is allowed if and only if the particular codeword array X satisfies the 2-D constraint.

In some embodiments, the 2-D constraint is defined in terms of a pair of one dimensional (1-D) constraints. In particular, the pair of 1-D constraints may represent constraints applied separately or independently to the rows and the columns of the codeword arrays. Thus, a first 1-D constraint of the pair may be a horizontal constraint H that constrains rows of the codeword arrays. A second 1-D constraint may be a vertical constraint V that constrains columns of the codeword arrays. Together the horizontal and vertical constraints H, V constrain the rows and the columns of the codeword arrays and effectively define a 2-D constraint on the codeword arrays.

For example, the horizontal constraint H on a codeword array X comprising binary symbols (i.e., $x \in \Sigma = \{0,1\}$) may stipulate that for each instance of a one (1) in a row of the codeword array, the instance is to be both preceded and followed (i.e., flanked) by a zero (0). In other words, the codeword array must conform to the pattern '010' for all x=1 in each row of the codeword array. Similarly for example, the vertical constraint V may stipulate that all of the ones in each column be flanked by a pair of zeros such that the columns conform to the pattern '00100' for each instance of '1' in the columns.

Further herein, the two 1-D constraints (i.e., the horizontal and vertical constraints H, V) may also effectively be represented as $|\Sigma| \times |\Sigma|$ transition matrices H and V having rows and columns indexed by $\Sigma$, where the function '|•|' denotes cardinality. Thus, $H(x_i, x_j)$ and $V(x_i, x_j)$ represent entries in H and V indexed by $x_i$ and $x_j \in \Sigma$.

Herein, a horizontal constraint set $\mathcal{H}_n$ is defined as a set of symbol sequences of length n, wherein each symbol sequence in the set satisfies the horizontal constraint H. Similarly, a vertical constraint set $\mathcal{V}_n$ is defined as a set of n-length symbol sequences that each satisfy the vertical constraint V. As such, an exemplary sequence $x_1 x_2 x_3 \ldots x_n$ is included in the horizontal constraint set $\mathcal{H}_n$ if and only if $H(x_i, x_{i+1})=1$ for all $i=1, 2, \ldots n-1$. Similarly, an exemplary sequence $x_1 x_2 x_3 x_n$ is included in the vertical constraint set $\mathcal{V}_n$ if and only if $V(x_i, x_{i+1})=1$ for all $i=1, 2, \ldots n-1$. Further herein, a "wild card" symbol in the alphabet, denoted '0'$\in \Sigma$, is a particular symbol that may one or both of precede and follow any symbol in $\Sigma$, both horizontally and vertically. In other words, $H(0, x)=H(x, 0)=V(0, x)=V(x, 0)=1$ for every $x \in \Sigma$.

Herein, an allowed 2-D constraint set $\mathcal{A}_{n,m}$ is a set of n×m arrays having rows and columns that belong to the horizontal constraint set $\mathcal{H}_n$ and the vertical constraint set $\mathcal{V}_m$, respectively. A capacity $C_{H,V}$ of the 2-D constraint based on the pair of 1-D constraints H and V is given by $$C_{H,V} = \lim_{n,m \to \infty} \frac{1}{mn} \log |\mathcal{A}_{n,m}|$$

Herein, for any array or matrix X, X(i, j) denotes the array entry in the i-th row and j-th column of the array X. Further, the notation '$X(i_1:i_2,j_1:j_2)$' denotes a sub-array of the array X, the sub-array having rows that range from $i_1$ to $i_2$ and columns that range from $j_1$ to $j_2$ (i.e., a sub-array $X(i, j)_{i=i_1,j=j_1}^{i_2,j_2}$). Similarly, the notation X(i,:) and X(:, j) respectively denote the i-th row and j-th column of the array X Further, $x^l$ denotes a sequence of symbols x of length l (e.g., $x_1 x_2 \ldots x_l$). As such, for a positive integer l and a symbol $y \in \Sigma$, a subset $\mathcal{H}_l(y) \subseteq \mathcal{H}_l$ is defined by $$\mathcal{H}_l(y) = \{\omega^l \in \mathcal{H}_l : y\omega^l \in \mathcal{H}_{l+1}\}$$

The subset $\mathcal{V}_l(y) \subseteq \mathcal{V}_l$ may be similarly defined. Herein, for any m-length column of symbols $y^m \in \Sigma^m$, the following definition holds $$\mathcal{A}_{m,l}(y^m) = \{x \in \mathcal{A}_{m,l} : y^m x \in \mathcal{A}_{m,l+1}\}$$

where $y^m x$ denotes an m×(l+1) array with a first column equal to $y^m$ and remaining column(s) equal to columns of the array x. Further herein, a probability measure $p_{X^{m \times k}|y^m}^{(l)}$ is defined for any column $y^m \in \mathcal{V}_m$ and for any array $X^{m \times k}$ having m rows and k columns (i.e., an m×k array) as $$p_{X^{m \times k}|Y^m}^{(l)}(X^{m \times k} | y^m) = \prod_{j=1}^{m} \frac{|\{\tilde{x}^l \in \mathcal{H}_l(y_j) : \tilde{x}^k = X(j, :)\}|}{|\mathcal{H}_l(y_j)|}$$

Thus, the probability $p_{X^{m \times k}|y^m}^{(l)}(X^{m \times k}|y^m)$ is equal to the probability that a first (i.e., leftmost) k columns in an m×l extension of $y^m$ (i.e., an extension into an m×(l+1) array) equals $X^{m \times k}$ assuming a uniform distribution over all m×l extensions of $y^m$ with rows satisfying just the horizontal constraint H. As such, in the limit as $l \to \infty$, $$p_{X^{m \times k}|Y^m}^{(l)}(X^{m \times k} | y^m) \to p_{X^{m \times k}|Y^m}^{(\infty)}(X^{m \times k} | y^m) \triangleq \prod_{j=1}^{m} p_{X^{1 \times k}|Y}(X(j,:) | y_j)$$

where $p_{X^{1 \times k}|Y}(\omega|y)$ is the probability, according to a maximum entropic Markov chain on the horizontal constraint H, for $\omega \in \mathcal{H}_k$ following $y \in \Sigma$, conditioned on y.

Further, as used herein, the article 'a' is intended to have its ordinary meaning in the patent arts, namely 'one or more'. For example, 'a constraint' means one or more constraints and as such, 'the constraint' means 'the constraint(s)' herein. Also, any reference herein to 'top', 'bottom', 'upper', 'lower', 'up', 'down', 'front', 'back', 'left' or 'right' is not intended to be a limitation herein. Moreover, examples herein are intended to be illustrative only and are presented for discussion purposes and not by way of limitation.

FIG. 1 illustrates a flow chart of a method 100 of approximate enumerative coding satisfying a 2-dimensional (2-D) constraint, according to an embodiment of the present invention. The method 100 of approximate enumerative coding illustrated in FIG. 1 encodes a message M as a codeword array X Specifically, the codeword array X produced by encoding represents a one-to-one mapping of the message M into a set of allowed codeword arrays of the approximate enumerative coding. The codeword array X may be one or more of stored in memory, transmitted over a communication channel, and presented to a user. For example, the codeword array X may be one or more of stored in an optical memory, printed as a 2-D barcode, or transmitted over a dense-wavelength division multiplexing (DWDM) based communications channel (e.g., an optical communications channel).

The method 100 of approximate enumerative coding comprises providing 110 the message M representing physical information. For example, the message M may represent a digital image of a physical scene captured by a digital imaging device. In another example, the physical information may represent data collected by a sensor (e.g., an X-ray or optical sensor). In yet another example, the physical information may represent money in an account or units manufactured or sold. In yet another example, the physical information may be representative of a document (e.g., a digital document or a digital book). In yet another example, the physical information may be a serial number or similar indicia of a device or apparatus. As used herein, the term 'physical information' is defined as information that is related to or describes something physical (as opposed to arbitrary or abstract information).

Moreover, regardless of the actual physical information that the message M may represent, the message M itself may be represented in various forms. For example, the message M may be represented as an arbitrary integer (i.e., M is integer-valued), for example. In another example, the message M may be a fixed-length binary message string or a fixed-size binary array. In yet another example, the message M may be represented as a fixed-size hexadecimal number or even as a finite real number. However, it is recognized for the purposes of discussion herein that all such exemplary fixed-length binary message strings, fixed-size binary arrays, fixed size hexadecimal numbers and finite real numbers may be mapped in a unique way (i.e., a one-to-one mapping) into an equivalent integer-valued message M. As such, herein the message M will be assumed to be an integer-valued message M without effective limitation to the scope of the meaning of the term 'message M.'

In some embodiments, the integer-valued message M is a member of a set $[0, \lceil L_{m,n}(0^m) \rceil]$, where $L_{m,n}(0^m)$ is a lower bound on a cardinality of a set of codewords (or equivalently codeword arrays X) that satisfy the 2-D constraint and the expression $\lceil z \rceil$ denotes the ceiling of z which is the smallest integer greater than or equal to z. In other words, the integer-valued message M is effectively small enough to be uniquely represented by the set of codewords that satisfy the 2-D constraint.

In general, a coding rate of the approximate enumerative coding is increased as the lower bound $L_{m,n}(0^m)$ is tightened. In the present invention, enumerative coding is employed except that an exact cardinality of corresponding sets of codewords is replaced by lower bounds such as $L_{m,n}(0^m)$ while still maintaining a unique mapping. In this respect, $L_{m,n}(0^m)$ approximates the true cardinality. In particular, the lower bounds employed herein effectively approximate the cardinality 'from below' in that the lower bound approximation employed herein will not exceed the true cardinality. As such, herein 'cardinality-approximating lower bound' or 'C-A lower bound' is defined to be a lower bound that 'approximates-from-below' and that does not exceed the true cardinality of the codeword set. There may be one or more C-A lower bounds, according to various embodiments.

The method 100 of approximate enumerative coding further comprises encoding 120 the message M as a codeword array X. Encoding effectively transforms the physical information represented by the message M into another form, namely that of the codeword array X. Thus, the physical information is transformed by encoding 120. Encoding 120 comprises determining 120 entries in the codeword array X using a cardinality-approximating (C-A) lower bound. In some embodiments, the C-A lower bound is a function of a memory term k and a cardinality of a set of sequences satisfying a horizontal constraint. In some of these embodiments, the C-A lower bound is further a function of a columnar extension probability of the 2-D constraint and a non-negative constant that is a function of the columnar extension probability.

In some embodiments, encoding 120 is performed by an encoder apparatus. For example, the encoder apparatus may comprise a general purpose computer that is programmed to perform the encoding 120, for example. As such, the programming effectively transforms the general purpose computer into a particular machine having a specific function, namely encoding 120. In another example, the encoder apparatus may be implemented as a specialized processor (e.g., a graphics processor) that is controlled by one or more of software and firmware to provide the encoding 120. In yet another example, the encoder apparatus may be a logic device that performs the encoding 120. The logic device that implements the encoder apparatus may be either constructed from discrete logic elements, constructed using a combination of discrete elements and programmable devices, or implemented as an application specific integrated circuit (ASIC), for example.

In an exemplary embodiment wherein the codeword array X is encoded 120 to store the message M in memory (e.g., optical memory), the encoder apparatus may be part of a memory controller or input/output (I/O) circuit, for example. Exemplary embodiments that employ the encoding 120 to transmit the codeword array X over a DWDM based communications channel may implement the encoder apparatus as part of a DWDM transceiver module, for example. A printer that produces exemplary 2-D barcodes from the codeword array X that results from encoding 120 may include the encoder apparatus as part of the data input path to the printer, for example.

In some embodiments, the C-A lower bound is denoted $L_{m,l}^{[k]}(y^m)$, where m and l are integers, and the C-A lower bound is given by equation (1) as $$L_{m,l}^{[k]}(y^m) = \begin{cases} \left(\prod_{j=1}^{m} |\mathcal{H}_l(y_j)|\right) Q_{m,l}^{[k-1]}(y^m) \left(\prod_{i=k}^{l} q_{m,i}^{[k]}\right) & \text{if } k \leq l \\ \left(\prod_{j=1}^{m} |\mathcal{H}_l(y_j)|\right) Q_{m,l}^{[l]}(y^m) & \text{if } k > l \end{cases} \quad (1)$$

where $y^m$ is a column of symbols of length m; $y_j$ is a j-th symbol in the column $y^m$; $\mathcal{H}_l(y_j)$ is a set of sequences of length l+1 that start with the j-th symbol $y_j$ and belong to a horizontal constraint; the function '|•|' denotes the cardinality of the set $\mathcal{H}_l(y_j)$; $Q_{m,l}^{[k-1]}(y^m)$ and $Q_{m,l}^{[l]}(y^m)$ are the columnar extension probabilities of the 2-D constraint; and $q_{m,i}^{[k]}$ is the non-negative constant. In some embodiments, the horizontal constraint is the 1-D horizontal constraint H described above that, when paired with the vertical constraint V, provides the 2-D constraint.

In some embodiments, the columnar extension probability is denoted $Q_{m,l}^{[k-1]}(y^m)$ where the parameter [k-1] is the memory term k minus 1. For a memory term k>0, and for each m, l and each $y^m \in \mathcal{V}_m$, the columnar extension probability $Q_{m,l}^{[k-1]}(y^m)$ is defined as the probability that a first [k-1] columns of an extension of a column $y^m$ by an m×l array forms an m×k constrained array with first column $y^m$. Specifically, the columnar extension probability $Q_{m,l}^{[k-1]}(y^m)$ is given by equation (2a) as $$Q_{m,l}^{[k]}(y^m) = \sum_{X^{m \times k} \in \mathcal{A}_{m,k}(y^m)} p_{X^{m \times k}|Y^m}^{(l)}(X^{m \times k} | y^m) \quad (2a)$$

with k←k-1. Equivalently, the columnar extension probability $Q_{m,l}^{[k-1]}(y^m)$ may be computed according to equation (2b)

$$Q_{m,l}^{[k]}(y^m) = e\left(\prod_{j=1}^{m} \left(V^{[k]} D_l^{[k]}(y_j)\right)\right) 1 \quad (2b)$$

with k←k-1, where $y^m$ is a column of symbols of length m; $y_j$ is a j-th symbol in the column $y^m$; $V^{[k]}$ denotes an adjacency matrix of a 1-dimensional (1-D) constraint having elements that are a set of [k]-width vertical stripes that satisfy the 2-D constraint; $D_l^{[k]}(y_j)$ is a diagonal probability matrix; e is a selector row vector; and 1 is a summing column vector. Herein, the columnar extension probability $Q_{m,l}^{[k-1]}(y^m)$ of equations (2a) and (2b) in the parameter [k-1] for k=1 is defined to be equal to 1 (i.e., $Q_{m,l}^{[0]}(y^m) \triangleq 1$).

The adjacency matrix $V^{[k]}$ in a parameter [k] has dimension $|\mathcal{H}_k| \times |\mathcal{H}_k|$ and is viewed or evaluated over an alphabet of $\mathcal{H}_k$. Similarly, the adjacency matrix $V^{[k-1]}$ in the parameter [k-1] has dimension $|\mathcal{H}_{k-1}| \times |\mathcal{H}_{k-1}|$ and is viewed over an alphabet of $\mathcal{H}_{k-1}$. Further, the diagonal probability matrix $D_l^{[k]}(y)$ in parameters [k] and y is defined as a diagonal matrix of dimensions $|\mathcal{H}_k| \times |\mathcal{H}_k|$ having rows and columns indexed by elements of $\mathcal{H}_k$. An x-th (for $x \in \mathcal{H}_k$) diagonal element or entry in the diagonal probability matrix $D_l^{[k]}(y)$ is equal to a probability $p_{X^{l \times k}|Y^m}^{(l)}(x|y)$ (as obtained by setting m=1 in $p_{X^{m \times k}|Y^m}^{(l)}(X^{m \times k}|y^m)$ defined previously). The selector row vector e in equation (2b) is defined as a real-valued row vector having a '1' in a location corresponding to a location of an all-0 (i.e., all-wild-card) array element of $\mathcal{H}_k$ and having zeros ('0's) at all other locations (e.g., e=[0 0 0 . . . 0 1 0 . . . 0]). The summing column vector 1 is defined as a real-valued column vector having a '1' in each location of the column vector (i.e., $1=[1\ 1\ 1\ \ldots\ 1]^T$ where 'T' indicates a transpose of a vector).

In some embodiments, the non-negative constant $q_{m,i}^{[k]}$ is chosen to satisfy equation (3)

$$q_{m,i}^{[k]} \leq \min_{y^m \in \mathcal{V}_m} \frac{Q_{m,l}^{[k]}(y^m)}{Q_{m,l}^{[k-1]}(y^m)} \quad (3)$$

where $Q_{m,l}^{[k]}(y^m)$ is a columnar extension probability of a first k columns of an extension of the column $y^m$; $\mathcal{V}_m$ is a set of length m sequences that satisfies a vertical constraint; and the function 'min(•)' returns a minimum value of an argument of the function evaluated for all $y^m$ that are members of the vertical constraint sequence set $\mathcal{V}_m$. Note that the columnar extension probability $Q_{m,l}^{[k]}(y^m)$ is essentially the columnar extension probability of equation (2b). By convention herein, zero divided by zero is defined to be infinity (i.e., 0/0=∞).

In some embodiments, encoding 120 the message M as a codeword array X may be implemented by the encoder apparatus (e.g., an encoder processor) executing pseudo-code (e.g., by implementing the pseudo-code using a computer programming language). In particular, for a codeword array X of size m×n, where m and n are integers, and having an integer-valued message M, encoding 120 may be implemented by the pseudo-code comprising:

```
M' ← M;
for j ← 1 to n do
    for i ← 1 to m do
        for each ω ∈ Σ, let
            L(ω) = [ Σ_{y^m ∈ A_{m,1}(X(:,j-1)): y_{i-1}=X(1:i-1,j), y_i=ω} L_{m,n-j}^{[k]}(y^m) ];
        end;
        X(i,j) ← max{y': Σ_{ω≤y'} L(ω) ≤ M' < Σ_{ω≤y'} L(ω)};
        M' ← M' - Σ_{ω<X(i,j)} L(ω);
    end;
end;
``` where X (i,j) are elements in the codeword array X indexed on integers i and j; $\mathcal{A}_{m,l}(X(:,j-1))$ is the set of all columns that can be adjacent to the right of the column X(:,j-1) according to the 2-D constraint; Σ is the ordered, finite codeword alphabet and ω is a symbol in Σ; a variable M' and the message M are integers in the range [0, $\lceil L_{m,n}^{[k]}(0^m) \rceil$]; $L_{m,n-j}^{[k]}(y^m)$ is the C-A lower bound parameterized in terms of the memory term k, the size variables m and n, and the integer j; and the expression ⌈z⌉ denotes the ceiling of z which is the smallest integer greater than or equal to z. Determining 120 entries effectively provides an approximate enumerative encoding of the message M as a codeword X.

In some embodiments, the method 100 of approximate enumerative coding further comprises decoding the codeword X. Decoding may be provided by a decoder processor or a decoding apparatus, for example. Decoding the codeword X reproduces or regenerates the message M. In some embodiments, decoding implements pseudo-code comprising:

```
M ← 0;
for j ← 1 to n do
    for i ← 1 to m do
        M ← M + Σ_{ω<X(i,j)}L(ω);
    end;
end;
``` where $L(\omega)$ is the same as was generated by the encoding described above.

In some embodiments, the 2-D constraint is applied on a symbol-by-symbol basis. In other embodiments, the 2-D constraint and the approximate enumerative coding may be applied to overlapping blocks of symbols wherein the constraint enforces that the overlapping blocks have the same symbols in the overlapping regions, in addition to the desired constraint on the constituent symbols. In particular, a desired non-row-column 2D constraint that is specified in terms of a finite list of arrays that are not allowed to occur as sub arrays in a constrained array may be converted to such a row-column 2-D constraint on sufficiently large overlapping blocks. Using this conversion, such constraints as no isolated 1's or 0's (each bit is equal to at least one of its four neighbors) can be readily handled according to embodiments of the present invention.

Figure 2:
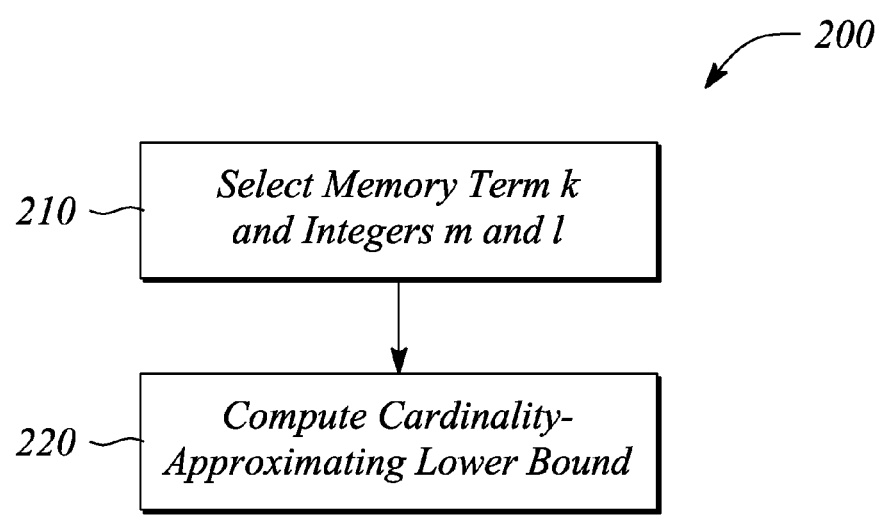
FIG. 2 illustrates a flow chart of a method of determining a cardinality-approximating (C-A) lower bound of an enumerative coding with a 2-dimensional (2-D) constraint, according to an embodiment of the present invention.

FIG. 2 illustrates a flow chart of a method 200 of determining a cardinality-approximating (C-A) lower bound of an enumerative coding with a 2-dimensional (2-D) constraint, according to an embodiment of the present invention. As illustrated in FIG. 2, the method 200 of determining a C-A lower bound comprises selecting 210 an integer-valued memory term k that is greater than or equal to one, and integer values m and l. For example, given a codeword array X having m rows and n columns (i.e., an m×n array), the integer value m may be the number of rows m. Similarly, the integer value l may be less than or equal to the number of columns n in the codeword X (i.e., l≤n), for example.

The method 200 of determining the C-A lower bound further comprises computing 220 the C-A lower bound denoted $L_{m,l}^{[k]}(y^m)$ according to equation (1) above. Computing 220 uses one or both of an encoder processor and a decoder processor. In some embodiments, the computed 220 C-A lower bound is one or more of stored in memory, transmitted over a communication channel, and output to a user. In some embodiments, a non-negative constant in equation (1) satisfies inequality (3) above. Similarly, in some embodiments, a columnar extension probability of the 2-D constraint is determined according to one or both of equations (2a) and (2b) above.

In some embodiments, the computed 220 C-A lower bound is employed to encode a message M to produce a codeword array X. In particular, the computed 220 C-A lower bound may be used in conjunction with approximate enumerative coding to encode the message M. In these embodiments, the codeword array X produced by the approximate enumerative coding may be one or more of stored in memory, transmitted over a communication channel, and presented to a user. Further, the computed 220 C-A lower bound may be employed to decode the codeword array X to reproduce the message M, according to some embodiments.

For example, the encoder processor may comprise a general purpose computer that is programmed to perform encoding associated with enumerative coding. Similarly, the decoder processor may comprise a general purpose computer that is programmed to perform decoding associated with enumerative coding, for example. As such, the programming effectively transforms the general purpose computer into a particular machine having a specific function, namely either encoding or decoding. In another example, either or both of the encoder processor and the decoder processor may be implemented as a specialized processor (e.g., an image processor) that is controlled by one or more of software and firmware to provide the respective encoding or decoding. In yet another example, either or both of the encoder processor and the decoder processor may be a logic device that respectively performs the encoding or decoding. The logic device that implements one or both of the encoder processor and the decoder processor ('encoder/decoder processor') may be either constructed from discrete logic elements, constructed using a combination of discrete elements and programmable devices, or implemented as an application specific integrated circuit (ASIC), for example. In some embodiments, the encoder/decoder processor may be effectively similar to the encoder apparatus described above with respect to method 100.

Figure 3:
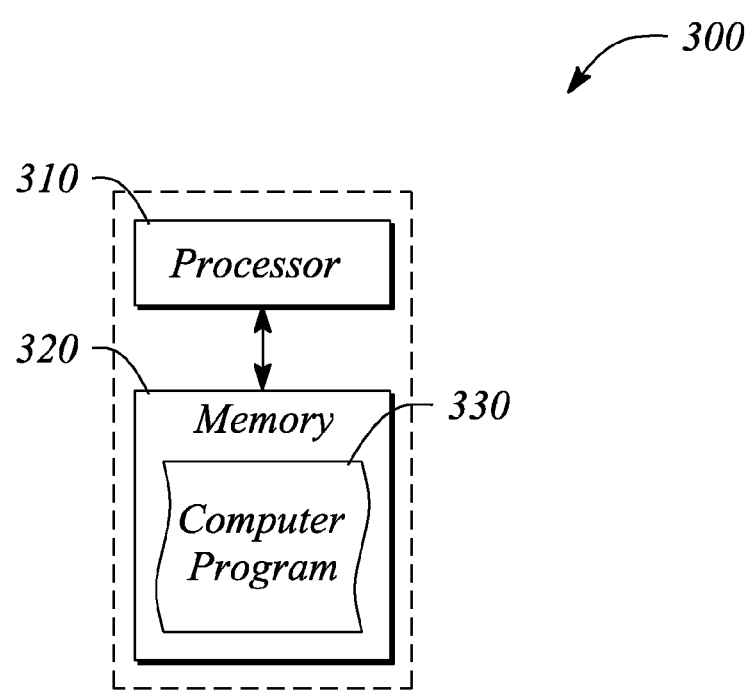
FIG. 3 illustrates a block diagram of an approximate enumerative coding apparatus, according to an embodiment of the present invention.

FIG. 3 illustrates a block diagram of an approximate enumerative coding apparatus 300, according to an embodiment of the present invention. As illustrated in FIG. 3, the approximate enumerative coding apparatus 300 comprise a processor 310. The processor 310 may be a general-purpose microprocessor, for example. In another example, the processor 310 may be specialized processor such as, but not limited to, an image or graphics processor and a communications processor.

The approximate enumerative coding apparatus 300 further comprises a memory 320. The memory 320 may comprise one or more of random access memory (RAM), read only memory (ROM), a computer hard disk, an optical disk, firmware, and 'dedicated' logic circuits. For example, the memory 320 may be implemented as RAM in a general purpose computer. In another example, the memory 320 may be memory built into a microprocessor. In yet another example, the memory 320 may be implemented as an application specific integrated circuit (ASIC) or as a field programmable gate array (FPGA) (i.e., dedicated logic circuits). The ASIC or FPGA implementations may combine both the memory 320 and the processor 310 in a single circuit, for example.

The approximate enumerative coding apparatus 300 further comprises a computer program 330 stored in the memory 320 and executed by the processor 310. The computer program 330 may be implemented using a high-level programming language such as, but not limited to, FORTRAN, C/C++, or C#, for example. In another example, the computer program 330 may be implemented as firmware or even as dedicated logic in the form of the ASIC or FPGA of the memory 320.

The computer program 330, when executed by the processor 310, implements approximate enumerative coding satisfying a 2-dimensional (2-D) constraint. The approximate enumerative coding comprises determining entries in a codeword array X from a message M using a cardinality-approximating (C-A) lower bound. The C-A lower bound is a function of several parameters, namely (a) an arbitrarily selected memory term k, (b) a cardinality of a set of sequences satisfying a horizontal constraint, (c) a columnar extension probability of the 2-D constraint, and (d) a non-negative constant that is a function of the columnar extension probability. The codeword array X has a size m×n, where m and n are integers. In some embodiments, the computer program 330 effectively implements one of method 100 or method 200, described above. In some embodiments, the computer program 330 may effectively implement one or both of the encoding pseudo-code and the decoding pseudo-code, described above.

Thus, there have been described embodiments of a method of approximate enumerative coding and an approximate enumerative coding apparatus satisfying a 2-dimensional (2-D) constraint that employ a C-A lower bound. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of approximate enumerative coding satisfying a 2-dimensional (2-D) constraint, the method comprising:
providing a message M representing physical information; and
encoding the message M as a codeword array X using an encoder apparatus, encoding comprising determining entries in the codeword array X using a cardinality-approximating (C-A) lower bound, the C-A lower bound being a function of (a) an integer-valued term k that is greater than one, (b) a cardinality of a set of sequences satisfying a horizontal constraint, (c) a columnar extension probability of the 2-D constraint, and (d) a non-negative constant that is a function of the columnar extension probability,
wherein the codeword array X is one or more of stored in a memory, transmitted over a communication channel, and presented to a user.

2. The method of approximate enumerative coding of claim 1, wherein the C-A lower bound is denoted $L_{m,l}^{[k]}(y^m)$, m and l being integers, and is given by $$L_{m,l}^{[k]}(y^m) = \begin{cases} \left(\prod_{j=1}^{m} |\mathcal{H}_l(y_j)|\right) Q_{m,l}^{[k-1]}(y^m) \left(\prod_{i=k}^{l} q_{m,i}^{[k]}\right) & \text{if } k \leq l \\ \left(\prod_{j=1}^{m} |\mathcal{H}_l(y_j)|\right) Q_{m,l}^{[l]}(y^m) & \text{if } k > l \end{cases}$$

where $y^m$ is a column of symbols of length m, $y_j$ is a j-th symbol in the column $y^m$, $\mathcal{H}_l(y_j)$ is a set of sequences of length l+1 that start with the j-th symbol $y_j$ and belong to a horizontal constraint, the function '|•|' denotes the cardinality of the set $\mathcal{H}_l(y_j)$, $Q_{m,l}^{[k-1]}(y^m)$ and $Q_{m,l}^{[l]}(y^m)$ are the columnar extension probabilities of the 2-D constraint, and $q_{m,l}^{[k]}$ is the non-negative constant.

3. The method of approximate enumerative coding claim 2, wherein the non-negative constant $q_{m,i}^{[k]}$ satisfies $$q_{m,i}^{[k]} \leq \min_{y^m \in \mathcal{V}_m} \frac{Q_{m,l}^{[k]}(y^m)}{Q_{m,l}^{[k-1]}(y^m)}$$

where $Q_{m,l}^{[k]}(y^m)$ is a columnar extension probability of a first k columns of an extension of the column $y^m$, $\mathcal{V}_m$ is a set of length m sequences that satisfies a vertical constraint, and the function 'min(•)' returns a minimum value of an argument of the function evaluated for all columns $y^m$ that are members of the vertical constraint sequence set $\mathcal{V}_m$.

4. The method of approximate enumerative coding of claim 1, wherein the columnar extension probability is denoted $Q_{m,l}^{[k]}(y^m)$, a parameter k of the columnar extension probability being the term k, and is computed according to $$Q_{m,l}^{[k]}(y^m) = e\left(\prod_{j=1}^{m} \left(V^{[k]}D_l^{[k]}(y_j)\right)\right)1$$

where $y^m$ is a column of symbols of length m, $y_j$ is a j-th symbol in the column $y^m$, $V^{[k]}$ denotes an adjacency matrix of a 1-dimensional (1-D) constraint having elements that are a set of k-width vertical stripes that satisfies the 2-D constraint, and $D_l^{[k]}(y_j)$ is a diagonal probability matrix, e is a selector row vector, and 1 is a summing column vector.

5. The method of approximate enumerative coding of claim 1, wherein determining entries in the codeword array X of size m×n, m and n being an integers, is implemented by executing pseudo-code comprising:

```
M' ← M;
for j ← 1 to n do
    for i ← 1 to m do
        for each ω ∈ Σ, let
            L(ω) = [ Σ_{y^m ∈ 𝒜_{m,1}(X(:,j-1)): y^{j-1}=X(1:i-1,j),y_i=ω} L_{m,n-j}^{[k]}(y^m) ];
        end;
        X(i,j) ← max{y': Σ_{ω≤y'}L(ω) ≤ M' < Σ_{ω≤y'}L(ω)};
        M' ← M' - Σ_{ω<X(i,j)}L(ω);
    end;
end;
``` where X(i,j) are elements in the codeword array X indexed on integers i and j, $\mathcal{A}_{m,l}(X(:,j-1))$ is a set of all columns that can be adjacent to the right of a column X(:,j-1) according to the 2-D constraint, Σ is an ordered, finite codeword alphabet and ω is a symbol in Σ, a variable M' and the message M are integers in the range [0, $\lceil L_{m,n}^{[k]}(0^m) \rceil$], $L_{m,n-j}^{[k]}(y^m)$ is the C-A lower bound parameterized in terms of the term k, the size variables m and n, and the integer j, and the expression $\lceil z \rceil$ denotes the ceiling of z which is the smallest integer greater than or equal to z.

6. The method of approximate enumerative coding of claim 5, further comprising decoding the codeword array X, wherein decoding implements pseudo-code comprising:

```
M ← 0;
for j ← 1 to n do
    for i ← 1 to m do
        M ← M + Σ_{ω<X(i,j)}L(ω);
    end;
end.
```

7. The method of approximate enumerative coding of claim 1, wherein the codeword array X is one or more of stored in a 2-D memory, represented by a 2-D bar code, and transmitted over a 2-D communication channel.

8. The method of approximate enumerative coding of claim 1, wherein the 2-D constraint and approximate enumerative coding are applied to overlapping blocks of 2-D constrained symbols.

9. A method of determining a cardinality-approximating (C-A) lower bound of an enumerative coding with a 2-dimensional (2-D) constraint, the method comprising:
selecting an integer-valued term k that is greater than one, and integer values m and l; and computing using one or both of an encoder processor and a decoder processor the C-A lower bound denoted $L_{m,l}^{[k]}(y^m)$ according to $$L_{m,l}^{[k]}(y^m) = \begin{cases} \left(\prod_{j=1}^{m} |\mathcal{H}_l(y_j)|\right) Q_{m,l}^{[k-1]}(y^m) \left(\prod_{i=k}^{l} q_{m,i}^{[k]}\right) & \text{if } k \leq l \\ \left(\prod_{j=1}^{m} |\mathcal{H}_l(y_j)|\right) Q_{m,l}^{[l]}(y^m) & \text{if } k > l \end{cases}$$

where $y^m$ is a column of symbols of length m, $y_j$ is a j-th symbol in the column $y^m$, $\mathcal{H}_l(y_j)$ is a set of sequences of length l+1 that start with the j-th symbol $y_j$ and belong to a horizontal constraint, the function '|•|' denotes a cardinality of the set $\mathcal{H}_l(y_j)$, $Q_{m,l}^{[k-1]}(y^m)$ and $Q_{m,l}^{[l]}(y^m)$ are columnar extension probabilities of the 2-D constraint, and $q_{m,i}^{[k]}$ is a non-negative constant, wherein the C-A lower bound is one or more of stored in a memory, transmitted over a communication channel, and output to a user.

10. The method of determining of claim 9, wherein the non-negative constant $q_{m,i}^{[k]}$ satisfies $$q_{m,i}^{[k]} \leq \min_{y^m \in \mathcal{V}_m} \frac{Q_{m,l}^{[k]}(y^m)}{Q_{m,l}^{[k-1]}(y^m)}$$

where $Q_{m,l}^{[k]}(y^m)$ is a columnar extension probability of a first k columns of an extension of the column $y^m$, $\mathcal{V}_m$ is a set of length m sequences that satisfies a vertical constraint, and the function 'min(•)' returns a minimum value of an argument of the function evaluated for all columns $y^m$ that are members of the vertical constraint sequence set $\mathcal{V}_m$.

11. The method of determining of claim 9, wherein the C-A lower bound is employed to encode a message M using the encoder processor to produce a codeword array X using approximate enumerative coding, wherein the codeword array X produced by the encoder processor is one or more of stored in a memory, transmitted over a communication channel, and presented to a user.

12. The method of claim 11, wherein the C-A lower bound is further employed to decode the codeword array X using the decoder processor to reproduce the message M.

13. An approximate enumerative coding apparatus comprising:
   an encoder processor;
   a memory;
   a computer program stored in the memory and executed by the encoder processor, when executed, implementing approximate enumerative coding satisfying a 2-dimensional (2-D) constraint, the approximate enumerative coding comprising determining entries in a codeword array X from a message M using a cardinality-approximating (C-A) lower bound, the C-A lower bound being a function of all of an arbitrarily selected integer-valued term k that is greater than one, a cardinality of a set of sequences satisfying a horizontal constraint, a columnar extension probability of the 2-D constraint, and a non-negative constant that is a function of the columnar extension probability, wherein the codeword array X has a size m×n, m and n being integers.

14. The apparatus of claim 13, wherein the C-A lower bound is denoted $L_{m,l}^{[k]}(y^m)$ and is given by $$L_{m,l}^{[k]}(y^m) = \begin{cases} \left(\prod_{j=1}^{m} |\mathcal{H}_l(y_j)|\right) Q_{m,l}^{[k-1]}(y^m) \left(\prod_{i=k}^{l} q_{m,i}^{[k]}\right) & \text{if } k \leq l \\ \left(\prod_{j=1}^{m} |\mathcal{H}_l(y_j)|\right) Q_{m,l}^{[l]}(y^m) & \text{if } k > l \end{cases}$$

where variable l is an integer, $y^m$ is a column of symbols of length m, $y_j$ is a j-th symbol in the column $y^m$, the function $|\mathcal{H}_l(y_j)|$ of length l+1 sequences that start with the j-th symbol $y_j$ and belong to a horizontal constraint, $Q_{m,l}^{[k-1]}(y^m)$ and $Q_{m,l}^{[l]}(y^m)$ are the columnar extension probabilities of the 2-D constraint, and $q_{m,i}^{[k]}$ is the non-negative constant.

15. The apparatus of claim 13, wherein the computer program further implements approximate enumerative coding by implementing pseudo-code to encode the message M, the encoding pseudo-code comprising:

```
M' ← M;
for j ← 1 to n do
    for i ← 1 to m do
        for each ω ∈ Σ, let
            L(ω) = [ Σ_{y^m ∈ 𝒜_{m,1}(X(:,j-1)):  L_{m,n-j}^{[k]}(y^m) ];
                     y^{i-1}=X(1:i-1,j), y_i=ω
        end;
        x(i,j) ← max{y': Σ_{ω<y'} L(ω) ≤ M' < Σ_{ω≤y'} L(ω)};
        M' ← M' - Σ_{ω<X(i,j)} L(ω);
    end;
end;
``` where X(i,j) are elements in the codeword array X indexed on integers i and j, $\mathcal{A}_{m,l}(X(:,j-1))$ is a set of all columns that can be adjacent to the right of column $X(:,j-1)$ according to the 2-D constraint, Σ is an ordered, finite codeword alphabet and w is a symbol in Σ, a variable M' and the message M are integers in the range $[0, \lceil L_{m,n}^{[k]}(0^m) \rceil]$, $L_{m,n-j}^{[k]}(y^m)$ is the C-A lower bound parameterized in the term k, the size variables m, n and the integer j, and the expression $\lceil z \rceil$ denotes the ceiling of z which is the smallest integer greater than or equal to z.

* * * * *

UNITED STATES PATENT AND TRADEMARK OFFICE
CERTIFICATE OF CORRECTION

PATENT NO. : 8,902,929 B2  
APPLICATION NO. : 13/258394  
DATED : December 2, 2014  
INVENTOR(S) : Erik Ordentlich et al.

Page 1 of 1

It is certified that error appears in the above-identified patent and that said Letters Patent is hereby corrected as shown below:

On the title page, in item (73), Assignee, in column 1, line 1, delete "Developent" and insert -- Development --, therefor.

In the Claims

In column 11, line 49, in Claim 3, delete "claim" and insert -- of claim --, therefor.

In column 12, line 56, in Claim 7, delete "Xis" and insert -- X is --, therefor.

In column 13, line 53 approx., in Claim 13, delete "when" and insert -- the computer program, when --, therefor.

In column 14, line 23 approx., in Claim 14, delete "of" and insert -- is a cardinality of a set 'H$_l$(y$_j$) of --, therefor.

Signed and Sealed this
Seventh Day of July, 2015

Michelle K. Lee
*Director of the United States Patent and Trademark Office*